US012627266B2

(12) United States Patent
Si et al.

(10) Patent No.: US 12,627,266 B2
(45) Date of Patent: May 12, 2026

(54) POWER AMPLIFICATION APPARATUS AND TRANSMITTER

(71) Applicant: SANECHIPS TECHNOLOGY CO., LTD., Shenzhen (CN)

(72) Inventors: Xiaoming Si, Shenzhen (CN); Nan Liu, Shenzhen (CN); Jie Hu, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 308 days.

(21) Appl. No.: 18/693,844

(22) PCT Filed: Mar. 2, 2022

(86) PCT No.: PCT/CN2022/078898
§ 371 (c)(1),
(2) Date: Mar. 20, 2024

(87) PCT Pub. No.: WO2023/045262
PCT Pub. Date: Mar. 30, 2023

(65) Prior Publication Data
US 2024/0388258 A1 Nov. 21, 2024

(30) Foreign Application Priority Data
Sep. 22, 2021 (CN) .......................... 202111109266.6

(51) Int. Cl.
*H03F 1/30* (2006.01)
*H03F 1/02* (2006.01)
(Continued)

(52) U.S. Cl.
CPC ........... *H03F 1/301* (2013.01); *H03F 1/0211* (2013.01); *H03F 3/245* (2013.01);
(Continued)

(58) Field of Classification Search
CPC ........ H03F 1/301; H03F 1/0211; H03F 3/245; H03F 2200/451; H04B 1/04; H04B 2001/0408
See application file for complete search history.

(56) References Cited

U.S. PATENT DOCUMENTS

| | | | | | |
|---|---|---|---|---|---|
| 6,714,071 B1 * | 3/2004 | Page | .................... | H03G 3/3047 | 330/285 |
| 7,868,601 B1 * | 1/2011 | Li | ............................ | G05F 1/56 | 323/283 |

(Continued)

FOREIGN PATENT DOCUMENTS

| | | |
|---|---|---|
| CN | 104321963 A | 1/2015 |
| CN | 104716905 A | 6/2015 |
| CN | 111697979 A | 9/2020 |

OTHER PUBLICATIONS

WIPO, International Search Report issued on May 20, 2022.

*Primary Examiner* — Junpeng Chen
(74) *Attorney, Agent, or Firm* — Li & Cai Intellectual Property (USA) Office

(57) ABSTRACT

Provided are a power amplification apparatus and a transmitter. The power amplification apparatus includes power amplification modules each including a voltage output unit and a power amplification unit; the voltage output unit outputs a first voltage signal (VIN_A) and a second voltage signal (VIN_B). The power amplification unit includes a selector (MUX), a radio frequency processing circuit, and a first switch transistor (M1), the radio frequency processing circuit processes a baseband signal to output a first radio frequency signal to a source of the first switch transistor (M1), and the selector (MUX) is configured to correspondingly strobe the first voltage signal (VIN_A) or the second voltage signal (VIN_B) according to an operating state of the first switch transistor (M1).

18 Claims, 5 Drawing Sheets

(51) Int. Cl.
  *H03F 3/24*          (2006.01)
  *H04B 1/04*          (2006.01)
(52) U.S. Cl.
  CPC .......... *H03F 2200/451* (2013.01); *H04B 1/04*
          (2013.01); *H04B 2001/0408* (2013.01)

(56)                References Cited

U.S. PATENT DOCUMENTS

| | | | |
|---|---|---|---|
| 9,641,141 B1 * | 5/2017 | Zheng ................... | H03F 3/2171 |
| 2006/0094395 A1 | 5/2006 | Lee et al. | |
| 2010/0041361 A1 | 2/2010 | Ojo | |
| 2010/0315168 A1 * | 12/2010 | Li ........................... | H03F 1/223 |
| | | | 455/73 |
| 2014/0049322 A1 * | 2/2014 | Jeon ...................... | H03F 1/0222 |
| | | | 330/296 |
| 2014/0111252 A1 * | 4/2014 | Zhuo ........................ | H03D 7/12 |
| | | | 327/109 |
| 2017/0359038 A1 * | 12/2017 | Tanaka ................... | H03F 3/005 |

\* cited by examiner

POWER AMPLIFICATION APPARATUS AND TRANSMITTER

CROSS-REFERENCE TO RELATED APPLICATIONS

The present application is based on and claims priority from the Chinese patent application No. 202111109266.6 filed on Sep. 22, 2021, the entire disclosure of which is incorporated herein by reference.

TECHNICAL FIELD

The present application relates to the field of communication technology, and particularly relates to a power amplification apparatus and a transmitter.

BACKGROUND

When a transmitter outputs high power, a switch transistor responsible for outputting the power will generate a significant voltage swing. Taking the switch transistor being an N-metal-oxide-semiconductor (NMOS) field effect transistor as an example, when a drain port of the NMOS switch transistor has a large voltage signal swing, a drain/source voltage Vds of the NMOS switch transistor may exceed a safe operating voltage range of the NMOS switch transistor, which may greatly shorten the service life of the NMOS switch transistor.

In some cases, to solve the problem of the shortened service life of the switch transistor due to the large voltage swing, a high-voltage-withstanding MOS switch transistor with a thickened gate oxide layer is typically used in an output stage of the power amplification apparatus, so that three ports of the MOS switch transistor are all ensured to work in a voltage safety range in various application scenarios of the transmitter. However, the high-voltage-withstanding MOS switch transistor with the thickened gate oxide layer has a relatively higher threshold voltage, consumes the voltage margin, and reduces the linear range of the output voltage of the transmitter, and may be not supported in some processes, while the additional gate oxide layer will add an additional mask layer, resulting in increased production cost. In other solutions, a method of reducing the power supply voltage may be adopted to keep the swing of the output signal within a safety range, but this method may greatly deteriorate the voltage linear range of the transmitter, and thus deteriorate a linearity index of the circuit.

SUMMARY

An embodiment of the present application provides a power amplification apparatus and a transmitter.

In a first aspect, an embodiment of the present application provides a power amplification apparatus, including a power amplification module including a voltage output unit and a power amplification unit, wherein the voltage output unit is configured to output a first voltage signal and a second voltage signal; the power amplification unit includes a selector, a radio frequency processing circuit, and a first switch transistor, an input of the selector is connected to the voltage output unit, an output of the selector is connected to a gate of the first switch transistor, and a source of the first switch transistor is connected to the radio frequency processing circuit; the radio frequency processing circuit is configured to receive and process a baseband signal to output a first radio frequency signal to the source of the first switch transistor; the selector is configured to strobe one of the first voltage signal or the second voltage signal, and output the strobed voltage signal to the gate of the first switch transistor; under the condition that the first switch transistor is in an on state, the selector strobes the first voltage signal, and the first switch transistor amplifies the first radio frequency signal to output a second radio frequency signal from a drain of the first switch transistor; and under the condition that the first switch transistor is in an off state, the selector strobes the second voltage signal.

In a second aspect, an embodiment of the present application provides a transmitter, including the power amplification apparatus as described in the first aspect.

BRIEF DESCRIPTION OF DRAWINGS

Accompanying drawings are provided for further understanding of the technical solution of the present application and constitute a part of the specification. Hereinafter, these drawings are intended to explain the technical solution of the present application together with the embodiments of the present application, but should not be considered as a limitation to the technical solution of the present application.

DETAIL DESCRIPTION OF EMBODIMENTS

In order to make the objects, technical solutions and advantages of the present application clearer and more apparent, the present application is further described in detail below with reference to the accompanying drawings and embodiments. It will be understood that the specific embodiments described herein are merely for illustration of the present application and are not intended to limit the present application.

It will be appreciated that in the description of the embodiments of the present application, should there be any reference to "first", "second" or the like, it is merely intended to distinguish technical features, instead of being interpreted as indicating or implying any relative importance or implying any number of the indicated technical features or implying any precedence of the indicated technical features. The phrase "at least one" means one or more, and "a plurality" means two or more. The term "and/or" describes an association relationship of associated objects, which may include three relationships; for example, A and/or B may refer to: A alone, A and B, or B alone, where A and B may be in singular or plural forms. The character "/" generally indicates that the former and latter associated objects are in an "or" relationship. The phrase "at least one of" and similar expressions refer to any group of the listed items, including any group of one or more of the listed items. For example, at least one of a, b or c may represent: a, b, c, a and b, a and c, b and c, or a and b and c, where a, b and c may be in single or multiple forms.

In addition, the technical features mentioned in the implementations of the present application below may be combined with each other as long as they do not conflict with each other.

Figure 1:
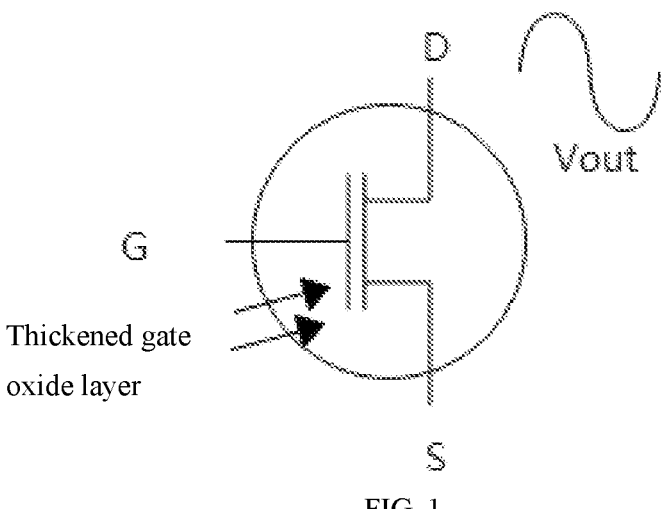
FIG. 1 is a schematic diagram showing a voltage signal swing at a drain port of an NMOS switch transistor outputting high power in the existing art.

When a transmitter outputs high power, a switch transistor responsible for outputting the power will generate a significant voltage swing. Referring to FIG. 1, taking an NMOS switch transistor as an example, a D port (drain) of the NMOS switch transistor has a large voltage signal swing, making a drain/source voltage Vds of the MOS switch transistor exceed a safety range of the working voltage of the MOS switch transistor, and thereby greatly shortening the service life of the MOS switch transistor.

In some cases, to solve the problem of the shortened service life of the switch transistor due to the large voltage swing, a high-voltage-withstanding MOS switch transistor with a thickened gate oxide layer is typically used in an output stage of the power amplification apparatus, so that three ports of the MOS switch transistor are all ensured to work in a voltage safety range in various application scenarios of the transmitter. In other solutions, a method of reducing the power supply voltage may be adopted to keep the swing of the output signal within a safety range.

Although the service life of the MOS switch transistor can be ensured, the above two methods have their respective defects. The high-voltage-withstanding MOS switch transistor with the thickened gate oxide layer has a relatively higher threshold voltage, consumes the voltage margin, and reduces the linear range of the output voltage of the transmitter, and may be not supported in some processes, while the additional gate oxide layer will add an additional mask layer, which may increase the production cost. One intuitive disadvantage of the method of reducing the power supply voltage is that the voltage linear range of the transmitter may greatly deteriorated, and thus a linearity index of the circuit is deteriorated.

Based on the above problems, embodiments of the present application provide a power amplification apparatus and a transmitter, which can ensure that the swing of the output signal is within a safety range without consuming the voltage margin or reducing the linear range of the output voltage, thereby solving the problem of the shortened service life of the switch transistor due to the large voltage swing.

Figure 2:
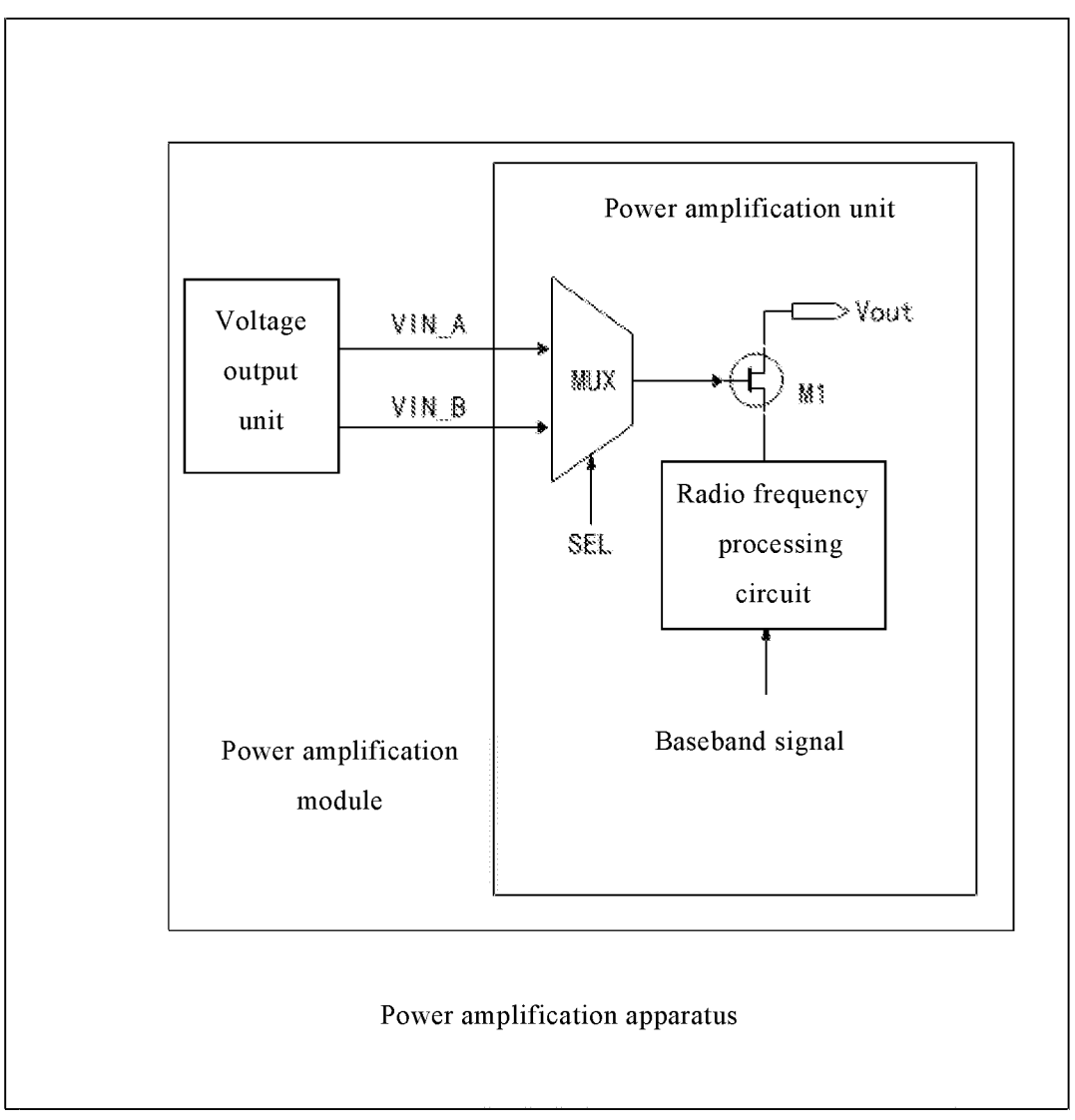
FIG. 2 is a block diagram of a power amplification apparatus according to an embodiment of the present application.

Referring to FIG. 2, FIG. 2 shows a block diagram of a power amplification apparatus according to an embodiment of the present application. As shown in FIG. 2, the power amplification apparatus according to the embodiment of the present application includes a power amplification module including a voltage output unit and a power amplification unit.

In an embodiment of the present application, the power amplification unit includes a selector (MUX), a radio frequency processing circuit, and a first switch transistor M1. An input of the selector is connected to the voltage output unit, an output of the selector is connected to a gate of the first switch transistor M1, a source of the first switch transistor M1 is connected to the radio frequency processing circuit, and a drain of the first switch transistor M1 is connected to a radio frequency output (Vout). It should be understood that the first switch transistor M1 described in the embodiments of the present application is an MOS switch transistor, which may specifically include an NMOS switch transistor or a PMOS switch transistor, and the NMOS switch transistor is taken as an example for description below.

In an embodiment of the present application, the voltage output unit includes two outputs, i.e., a first output and a second output. The first output is configured to output a first voltage signal (VIN_A), and the second output is configured to output a second voltage signal (VIN_B). The first output and the second output are correspondingly connected to two inputs of the selector, to transmit the first voltage signal and the second voltage signal to the power amplification unit.

It will be understood that the radio frequency processing circuit is configured to receive and process a baseband signal to output a first radio frequency signal to a source of the first switch transistor M1. Specifically, the radio frequency processing circuit may be connected to a baseband chip that is configured to encode speech or other data signals into baseband codes (i.e., baseband signals) for transmission, and the baseband chip outputs the baseband signal to the radio frequency processing circuit. After receiving an analog baseband (ABB) signal output from the baseband chip, the radio frequency processing circuit performs up-conversion on the ABB signal to generate a first radio frequency signal that is transmitted to the source of the first switch transistor M1.

It will be understood that the first switch transistor M1 is an output power transistor of the power amplification apparatus, and is configured to perform power amplification on the radio frequency signal and emit the amplified radio frequency signal from the radio frequency output. Specifically, the first switch transistor M1 performs power amplification on a first radio frequency signal obtained from the radio frequency processing circuit, outputs a second radio frequency signal through the drain of the first switch transistor M1, and then transmits the second radio frequency signal to the radio frequency output, where the second radio frequency signal is emitted through the radio frequency output.

It will be understood that the selector in the power amplification unit is configured to strobe one of the first voltage signal or the second voltage signal, and output the strobed voltage signal to the gate of the first switch transistor M1, so as to adjust a gate voltage of the first switch transistor M1 through the strobed voltage signal, thereby keeping the voltage swing at each of the three ports of the first switch transistor M1 within a safety range, and guaranteeing the service life of the MOS switch transistor.

It will be understood that the first switch transistor M1 includes two operating states, i.e., on and off, which have different requirements on the gate voltage of the first switch transistor M1. Therefore, the voltage output unit in the embodiments of the present application outputs two different types of voltage signals (the first voltage signal and the second voltage signal), so that the selector strobes the corresponding voltage signal based on the operating state of the first switch transistor M1, thereby satisfying the requirements on the gate voltage under different operating states.

Exemplarily, under the condition that the first switch transistor M1 is in an on state, the selector strobes the first voltage signal, and after the first switch transistor M1 performs power amplification on a first radio frequency signal obtained from the radio frequency processing circuit, a second radio frequency signal is transmitted from the drain of the first switch transistor M1.

Exemplarily, under the condition that the first switch transistor M1 is in an off state, the selector strobes the second voltage signal, and no radio frequency signal is output from the drain of the first switch transistor M1.

The operation principle of the power amplification apparatus according to the embodiments of the present application will be described in detail below.

When the first switch transistor M1 is in the on state, the power amplification unit is in an on state, and the selector strobes the first voltage signal. See the following equation (1), which shows how to calculate a saturation current $I_{DS}$ of the first switch transistor M1 operating in a saturation region.

$$I_{DS} = \frac{1}{2} * K * (V_G - V_S - V_{TH})^2 \quad (1)$$

where $V_G$ is a gate G voltage of the first switch transistor M1, $V_D$ is a drain D voltage of the first switch transistor M1, $V_S$ is a source S voltage of the first switch transistor M1, $V_{TH}$ is a threshold voltage for turning on the first switch transistor M1, and K is a constant factor.

Through conversion of the equation (1), an equation for calculating the source S voltage $V_S$ of the first switch transistor M1 can be obtained, which is shown as the following equation (2):

$$V_S = V_G - \sqrt{\frac{2 * I_{DS}}{K}} - V_{TH} \quad (2)$$

Based on the equation (2), an equation for calculating the drain/source voltage $V_{DS}$ of the first switch transistor M1 can be obtained, which is shown as the following equation (3):

$$V_{DS} = V_D - V_S = V_D + \left( \sqrt{\frac{2 * I_{DS}}{K}} + V_{TH} - V_G \right) \quad (3)$$

It will be appreciated that the safe operating voltage range of the MOS transistor is generally $V_{DS} < M * VDD$, where M is a coefficient (generally taking a value of 1.2), and VDD is the power supply voltage. Therefore, by appropriately increasing the voltage $V_G$, that is, by supplying an appropriate first voltage signal VIN_A to the gate of the first switch transistor M1 through the voltage output unit, the drain/source voltage of the first switch transistor M1 can satisfy $V_{DS} < M * VDD$, and thus satisfy the requirement on the service life of the MOS switch transistor.

When the first switch transistor M1 is in an off state, the power amplification unit is in an off state, and the selector strobes the second voltage signal. In this case, since the first switch transistor M1 has a saturation current $I_{DS} = 0$ and a gate/source voltage $V_{GS} << V_{TH}$, $V_G$ is approximate to $V_S$. Here, an approximation factor N is used to represent a difference between the two, that is, $V_S = V_G - N = VIN\_B - N$, and in this case, $V_{DS} = V_D - V_S = V_D - VIN\_B + N$. To satisfy $V_{DS} < M * VDD$, an appropriate second voltage signal VIN_B can be set such that a voltage value of the second voltage signal VIN_B−N is greater than $M * VDD - V_D$, thereby satisfying the requirement on the service life of the NMOS switch transistor.

In a specific implementation, the voltage value of the second voltage signal VIN_B−N may take a minimum value that satisfies the requirement on the service life, so as to ensure that the power amplification unit is completely turned off when the first switch transistor M1 is in an off state, thereby preventing leakage current of the baseband signal ABB from leaking to the radio frequency output.

Figure 3:
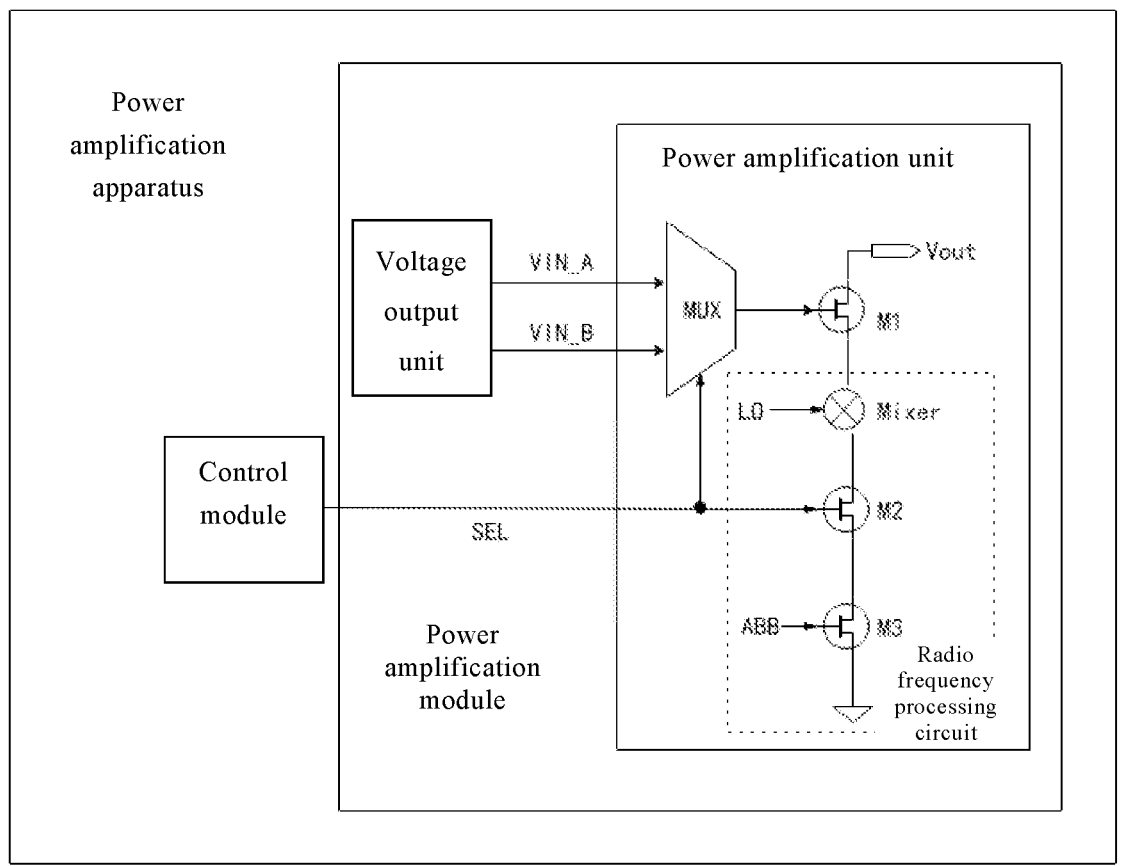
FIG. 3 is a schematic structural diagram of a power amplification apparatus according to an embodiment of the present application.

By way of example, referring to FIG. 3, FIG. 3 shows a schematic structural diagram of a radio frequency processing circuit according to an embodiment of the present application. As shown in FIG. 3, the radio frequency processing circuit may include a mixer (Mixer) configured to mix a baseband signal with a local oscillator (LO) signal to produce the first radio frequency signal. Here, the LO signal may also be referred to as a carrier signal, and by mixing the LO signal with the baseband signal, frequency translation of the baseband signal can be implemented to modulate a transmission signal onto a frequency band of the carrier signal. Specifically, a baseband signal and a local oscillator signal are received at two outputs of the mixer respectively, where the mixer mixes the baseband signal and the local oscillator signal to obtain a first radio frequency signal which is output to the source of the first switch transistor M1 through an output of the mixer.

It will be understood that the radio frequency processing circuit may further include a third switch transistor M3, a gate of the third switch transistor M3 is configured to receive the baseband signal, a source of the third switch transistor M3 is grounded, and a drain of the third switch transistor M3 is connected to the mixer. Specifically, the third switch transistor M3 here may be regarded as an input power amplification transistor for baseband signals, and the third switch transistor M3 may be connected to a baseband chip and configured to perform power amplification on a baseband signal obtained from the baseband chip, and then output the amplified baseband signal to the mixer.

As shown in FIG. 3, the power amplification apparatus may further include a control module. The control module is configured to output an instruction signal (SEL), which specifically includes a turn-on instruction signal or a turn-off instruction signal.

It will be understood that the selector is connected to the control module to receive the instruction signal output from the control module, so as to correspondingly strobe the first voltage signal or the second voltage signal according to the output instruction signal.

Specifically, under the condition that the instruction signal output from the control module is a turn-on instruction signal, the selector strobes the first voltage signal; and under the condition that the instruction signal output from the control module is a turn-off instruction signal, the selector strobes the second voltage signal.

Exemplarily, the turn-on instruction signal may be set to a high level "1", and the turn-off instruction signal may be set to a low level "0". When the power amplification unit is in an on state, the control module outputs the high level "1" to the selector, and the selector strobes the first voltage signal upon receiving the high level "1"; and when the power amplification unit is in an off state, the control module outputs the low level "0" to the selector, and the selector strobes the second voltage signal upon receiving the low level "0".

As shown in FIG. 3, the radio frequency processing circuit may further include a second switch transistor M2, where a gate of the second switch transistor M2 is connected to the control module to receive an instruction signal from the control module; a source of the second switch transistor M2 is connected to the source of the third switch transistor M3, and is configured to receive the baseband signal output from the third switch transistor M3; and a drain of the second switch transistor M2 is connected to the mixer, so that the baseband signal is output to the mixer through the drain of the second switch transistor M2.

It will be understood that the second switch transistor M2 plays a role of a switch in the power amplification unit, and controls the operating state (on or off) of the power amplification unit. For example, when the instruction signal received from the control module is a turn-on instruction signal, the second switch transistor M2 is in an on state, so that the first switch transistor M1 is also in an on state, and the whole power amplification unit is in an on operating state; and when the instruction signal received from the control module is a turn-off instruction signal (low level "0"), the second switch transistor M2 is in an off state, so that the first switch transistor M1 is also in an off state, and the whole power amplification unit is in an off operating state.

It will be understood that the control module outputs the same instruction signal to the second switch transistor M2 and the selector at the same time, so that the instruction signal output from the control module can be used for controlling the operating state of the power amplification unit and instructing the selector to perform a strobe operation corresponding to the operating state of the power amplification unit.

Exemplarily, when the control module outputs a turn-on instruction signal (high level "1") to the second switch transistor M2 and the selector at the same time, the power amplification unit is in the on operating state, the first switch transistor M1 and the second switch transistor M2 are both in the on state, and the selector strobes the first voltage signal to transmit the first voltage signal to the gate of the first switch transistor M1; and when the control module outputs a turn-off instruction signal (low level "0") to the second switch transistor M2 and the selector at the same time, the power amplification unit is in the off operating state, the first switch transistor M1 and the second switch transistor M2 are both in the off state, and the selector strobes the second voltage signal, and to transmit the second voltage signal to the gate of the first switch transistor M1.

Figure 4:
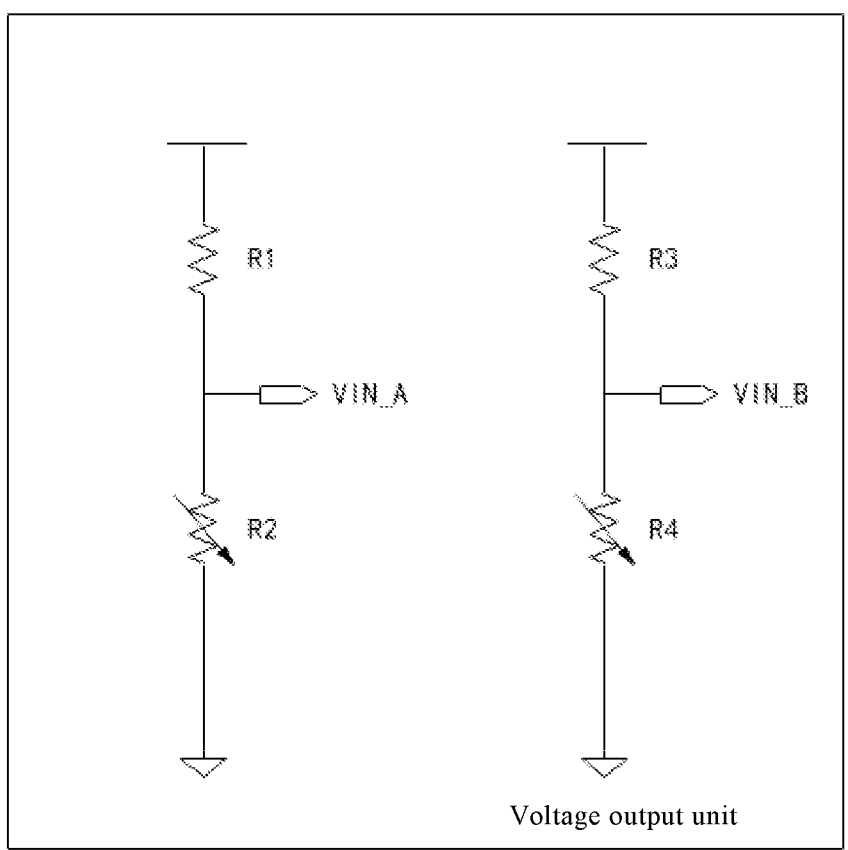
FIG. 4 is a schematic structural diagram of a voltage output unit according to an embodiment of the present application.

Exemplarily, referring to FIG. 4, the voltage output unit in the embodiments of the present application may include a first bias circuit and a second bias circuit. The first bias circuit is configured to output a first voltage signal, and the second bias circuit is configured to output a second voltage signal.

Exemplarily, the first bias circuit includes a first resistor, a second resistor and a first output. A first end of the first resistor is connected to a working power supply end, a second end of the first resistor is connected to a first end of the second resistor, a second end of the second resistor is connected to a ground terminal, the first output is disposed between the first resistor and the second resistor, and the first voltage signal is output from the first output. In a specific implementation, the first resistor and the second resistor with appropriate resistance values may be selected so that the first voltage signal output from the first output can satisfy the requirement on the gate voltage of the first switch transistor M1 in the on state, that is, the input gate voltage enables the drain/source voltage to satisfy $V_{DS}<M*VDD$, and thus satisfy the requirement on the service life of the output power switch transistor (i.e., the first switch transistor M1).

Exemplarily, the second bias circuit includes a third resistor, a fourth resistor and a second output. A first end of the third resistor is connected to a working power supply end, a second end of the third resistor is connected to a first end of the fourth resistor, a second end of the fourth resistor is connected to a ground terminal, the second output is disposed between the third resistor and the fourth resistor, and the second voltage signal is output from the second output. In a specific implementation, the third resistor and the fourth resistor with appropriate resistance values may be selected so that the voltage value of the second voltage signal VIN_B−N output from second output is greater than $M*VDD-V_D$, thereby satisfying the requirement on the gate voltage of the first switch transistor M1 in the off state, and satisfying the requirement on the service life of the output power switch transistor (i.e., the first switch transistor M1).

In a possible implementation, each of the second resistor and the fourth resistor is a variable resistor, and by adjusting the resistance values of the second resistor and the fourth resistor, the voltage values of the first voltage signal and the second voltage signal can be adjusted correspondingly, thereby implementing dynamic adjustment of the first voltage signal and the second voltage signal.

In another possible implementation, by inputting variable current to the first bias circuit and the second bias circuit respectively, and adjusting the current values of the power supply input to the first bias circuit and the second bias circuit, the voltage values of the first voltage signal and the second voltage signal can be adjusted correspondingly, thereby implementing dynamic adjustment of the first voltage signal and the second voltage signal.

Based on the above manners, both the first voltage signal and the second voltage signal can be flexibly adjusted, where the first voltage signal is adjusted to a proper level required to achieve better performance of the power amplification unit in the on state: and the second voltage signal is adjusted to a proper level that can satisfy the requirement on the service life of the first switch transistor M1 when turned off, and prevent leakage current of the LO signal and ABB from leaking out of the first switch transistor M1 at the same time.

It will be understood that the power amplification apparatus further includes a control module configured to determine a first voltage value corresponding to the first voltage signal according to a saturation current parameter, an on voltage threshold and a drain/source voltage parameter of the first switch transistor M1, and a power supply voltage parameter, and adjust a resistance value of the second resistor according to the first voltage value, so that the first bias circuit outputs the first voltage signal satisfying the first voltage value. The power supply voltage parameter is an output voltage of the working power supply end.

As can be seen from the foregoing description of the equation (3), the specific voltage value of the first voltage signal (i.e., the first voltage value) may be calculated from the saturation current parameter, the on voltage threshold, and the drain/source voltage parameter of the first switch transistor M1. On the premise that the drain/source voltage parameter $V_{DS}$ satisfies $V_{DS}<M*VDD$, a suitable first voltage value may be selected, and then the resistance value of the second resistor may be determined from the first voltage value. In other words, the resistance value of the second resistor is adjusted according to the first voltage value, so that the voltage output unit can output the first voltage signal satisfying the first voltage value.

It will be understood that the control module is further configured to determine a second voltage value corresponding to the second voltage signal according to the power supply voltage parameter and a drain voltage parameter of the first switch transistor M1, and adjust a resistance value of the fourth resistor according to the second voltage value, so that the voltage output unit outputs the second voltage signal satisfying the second voltage value.

It will be appreciated that the power supply voltage parameter refers to a voltage value of the voltage output from the working power supply end.

It will be understood that when the power amplification unit is in the off state, to make the first switch transistor M1 satisfy $V_{DS}<M*VDD$, a second voltage value of the second voltage signal VIN_B–N is set to be greater than $M*VDD-V_D$. In other words, based on the power supply voltage parameter and the drain voltage parameter of the first switch transistor M1, a second voltage value corresponding to the second voltage signal can be determined, and then based on the second voltage value, a resistance value of the fourth resistor can be determined. That is, the resistance value of the fourth resistor is adjusted according to the second voltage value, so that the voltage output unit can output the second voltage signal satisfying the second voltage value.

Figure 5:
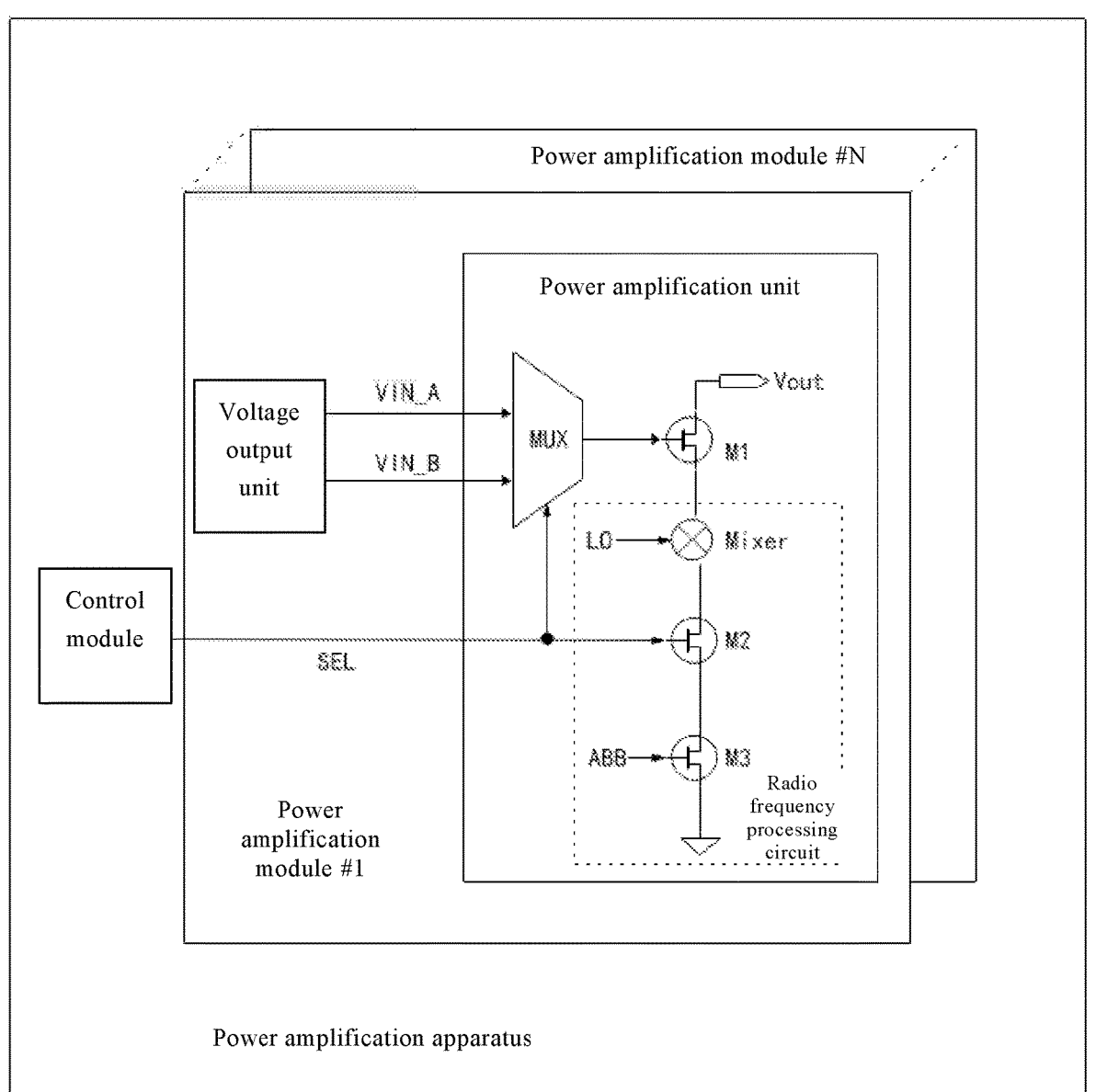
FIG. 5 is a schematic structural diagram of a power amplification apparatus according to a specific embodiment of the present application.

Referring to FIG. 5, FIG. 5 shows a power amplification apparatus according to a specific embodiment of the present application. As shown in FIG. 5, in the power amplification apparatus, a plurality of power amplification modules may be provided, and each of the power amplification modules is connected to the control module. The control module correspondingly controls the operating state (on or off) of each power amplification module. In other words, the output power of the power amplification apparatus can be adjusted by adjusting the number of power amplification modules in an on state in the power amplification apparatus.

For example, the power amplification apparatus includes N (N>0)) power amplification modules, and the control module outputs a turn-on instruction signal (high level "1") to M (N>M>0) power amplification units, so that the M power amplification units are in an on state: and the control module outputs a turn-off instruction signal (low level "(0") to the remaining N–M power amplification units, so that the N–M power amplification units are in an off state. To increase the output power of the power amplification apparatus, the control module may correspondingly increase the number of power amplification units in the on state: and to decrease the output power of the power amplification apparatus, the number of power amplification units in the on state may be reduced.

The power amplification apparatus according to the embodiment of the present application includes power amplification modules each including a voltage output unit and a power amplification unit. The voltage output unit outputs a first voltage signal and a second voltage signal. The power amplification unit includes a selector, a radio frequency processing circuit, and a first switch transistor M1. The radio frequency processing circuit processes a baseband signal to output a first radio frequency signal to a source of the first switch transistor M1. The selector is configured to correspondingly strobe the first voltage signal or the second voltage signal according to an operating state of the first switch transistor M1. Here, the first voltage signal and the second voltage signal are used for adjusting the gate voltage of the first switch transistor M1 in the corresponding operating state of the first switch transistor M1, so that voltage swings at three ports of the first switch transistor M1 are all within a safety range no matter whether the first switch transistor M1 is in an on state or in an off state, thereby guaranteeing the service life of the first switch transistor M1. In addition, the solution provided in the embodiments of the present application will not consume the voltage margin or reduce the linearity of the output voltage, and is easy to implement, and thus has higher practical and economic values.

An embodiment of the present application further provides a transmitter provided with any one of the power amplification apparatuses described above.

In a specific embodiment, the transmitter includes a power amplification apparatus including N power amplification modules and a control module. Each power amplification module includes a voltage output unit and a power amplification unit. The voltage output unit includes a first bias circuit and a second bias circuit. The first bias circuit is configured to output a first voltage signal VIN_A, and the second bias circuit is configured to output a second voltage signal VIN_B. The power amplification unit includes a selector MUX, a first switch transistor M1, a mixer Mixer, a second switch transistor M2, and a third switch transistor M3. The selector MUX includes two inputs correspondingly connected to the first bias circuit and the second bias circuit, and further includes an instruction input connected to the control module and configured to receive the instruction signal output from the control module. An output of the selector MUX is connected to a gate of the first switch transistor M1, a drain of the first switch transistor M1 is connected to a radio frequency output, and a source of the first switch transistor M1 is connected to an output of the mixer. One input of the mixer Mixer is configured to receive a local oscillator signal LO, and the other input is connected to a drain of the second switch transistor M2. A gate of the second switch transistor M2 is connected to the control module, and configured to receive the instruction signal output from the control module. A source of the second switch transistor M2 is connected to a drain of the third switch transistor M3, a gate of the third switch transistor M3 is configured to receive a baseband signal ABB, and a drain of the third switch transistor M3 is grounded. The working principle of the transmitter described in this embodiment may be referred to the foregoing related description, and is not repeated here.

The power amplification apparatus according to the embodiment of the present application includes power amplification modules each including a voltage output unit and a power amplification unit. The voltage output unit outputs a first voltage signal and a second voltage signal. The power amplification unit includes a selector, a radio frequency processing circuit, and a first switch transistor. The radio frequency processing circuit processes a baseband signal to output a first radio frequency signal to the source of the first switch transistor. The selector is configured to correspondingly strobe the first voltage signal or the second voltage signal according to an operating state of the first switch transistor M1. Here, the first voltage signal and the second voltage signal are used for adjusting the gate voltage of the first switch transistor in the corresponding operating state of the first switch transistor, so that voltage swings at three ports of the first switch transistor are all within a safety range no matter whether the first switch transistor is in an on state or in an off state, thereby guaranteeing the service life of the first switch transistor. In addition, the solution provided in the embodiments of the present application will not consume the voltage margin or reduce the linearity of the output voltage, and is easy to implement, and thus has higher practical and economic values.

In the above embodiments, the description of each embodiment has its own emphasis, and for parts that are not described or recited in a certain embodiment, reference may be made to the related description in other embodiments.

While the present application has been described with reference to several implementations above, the present application is not limited to the above implementations, and various equivalent variations or replacements may be made by those skilled in the art without departing from the spirit of the present application. Such equivalent variations or replacements fall into the scope as defined in the claims of the present application.

What is claimed is:

1. A power amplification apparatus, comprising a power amplification module comprising a voltage output unit and a power amplification unit, wherein the voltage output unit is configured to output a first voltage signal and a second voltage signal;

the power amplification unit comprises a selector, a radio frequency processing circuit, and a first switch transistor, an input of the selector is connected to the voltage output unit, an output of the selector is connected to a gate of the first switch transistor, and a source of the first switch transistor is connected to the radio frequency processing circuit;

the radio frequency processing circuit is configured to receive and process a baseband signal to output a first radio frequency signal to the source of the first switch transistor;

the selector is configured to strobe one of the first voltage signal or the second voltage signal, and output the strobed voltage signal to the gate of the first switch transistor;

under the condition that the first switch transistor is in an on state, the selector strobes the first voltage signal, and the first switch transistor amplifies the first radio frequency signal to output a second radio frequency signal from a drain of the first switch transistor; and under the condition that the first switch transistor is in an off state, the selector strobes the second voltage signal.

2. The power amplification apparatus according to claim 1, wherein the radio frequency processing circuit comprises a mixer configured to mix a baseband signal with a local oscillator signal to produce the first radio frequency signal.

3. The power amplification apparatus according to claim 2, wherein the power amplification apparatus further comprises a control module, and the radio frequency processing circuit comprises a second switch transistor;

the control module is configured to output an instruction signal;

a gate of the second switch transistor is configured to receive the instruction signal, a source of the second switch transistor is configured to receive the baseband signal, and a drain of the second switch transistor is connected to the mixer;

the instruction signal is a turn-on instruction signal or a turn-off instruction signal, and under the condition that the instruction signal output from the control module is a turn-on instruction signal, the first switch transistor and the second switch transistor are both in the on state; and under the condition that the instruction signal output from the control module is a turn-off instruction signal, the first switch transistor and the second switch transistor are both in the off state.

4. The power amplification apparatus according to claim 3, wherein the selector is connected to the control module to receive the instruction signal output from the control module;

under the condition that the instruction signal output from the control module is a turn-on instruction signal, the selector strobes the first voltage signal; and under the condition that the instruction signal output from the control module is a turn-off instruction signal, the selector strobes the second voltage signal.

5. The power amplification apparatus according to claim 2, wherein the radio frequency processing circuit further comprises a third switch transistor, a gate of the third switch transistor is configured to receive the baseband signal, a source of the third switch transistor is grounded, and a drain of the third switch transistor is connected to the mixer.

6. The power amplification apparatus according to claim 1, wherein the voltage output unit comprises:

a first bias circuit comprising a first resistor, a second resistor and a first output, wherein a first end of the first resistor is connected to a working power supply end, a second end of the first resistor is connected to a first end of the second resistor, a second end of the second resistor is connected to a ground terminal, the first output is disposed between the first resistor and the second resistor, and the first voltage signal is output from the first output;

a second bias circuit comprising a third resistor, a fourth resistor and a second output, wherein a first end of the third resistor is connected to the working power supply end, a second end of the third resistor is connected to a first end of the fourth resistor, a second end of the fourth resistor is connected to a ground terminal, the second output is disposed between the third resistor and the fourth resistor, and the second voltage signal is output from the second output.

7. The power amplification apparatus according to claim 6, wherein each of the second resistor and the fourth resistor is a variable resistor.

8. The power amplification apparatus according to claim 6, wherein the power amplification apparatus further comprises a control module configured to determine a first voltage value corresponding to the first voltage signal according to a saturation current parameter, an on voltage threshold and a drain/source voltage parameter of the first switch transistor, and a power supply voltage parameter, and adjust a resistance value of the second resistor according to the first voltage value, so that the voltage output unit outputs the first voltage signal satisfying the first voltage value; and the control module is further configured to determine a second voltage value corresponding to the second voltage signal according to the power supply voltage parameter and a drain voltage parameter of the first switch transistor, and adjust a resistance value of the fourth resistor according to the second voltage value, so that the voltage output unit outputs the second voltage signal satisfying the second voltage value;

wherein the power supply voltage parameter is an output voltage of the working power supply end.

9. The power amplification apparatus according to claim 1, wherein a plurality of power amplification modules are provided, and the power amplification apparatus further comprises a control module connected to each of the power amplification module.

10. A transmitter, characterized in comprising a power amplification apparatus according to claim 1.

11. The transmitter according to claim 10, wherein the radio frequency processing circuit comprises a mixer configured to mix a baseband signal with a local oscillator signal to produce the first radio frequency signal.

12. The transmitter according to claim 11, wherein the power amplification apparatus further comprises a control module, and the radio frequency processing circuit comprises a second switch transistor;

the control module is configured to output an instruction signal;

a gate of the second switch transistor is configured to receive the instruction signal, a source of the second switch transistor is configured to receive the baseband signal, and a drain of the second switch transistor is connected to the mixer;

the instruction signal is a turn-on instruction signal or a turn-off instruction signal, and under the condition that the instruction signal output from the control module is a turn-on instruction signal, the first switch transistor and the second switch transistor are both in the on state; and under the condition that the instruction signal output from the control module is a turn-off instruction signal, the first switch transistor and the second switch transistor are both in the off state.

13. The transmitter according to claim 12, wherein the selector is connected to the control module to receive the instruction signal output from the control module;

under the condition that the instruction signal output from the control module is a turn-on instruction signal, the selector strobes the first voltage signal; and under the condition that the instruction signal output from the control module is a turn-off instruction signal, the selector strobes the second voltage signal.

14. The transmitter according to claim 11, wherein the radio frequency processing circuit further comprises a third switch transistor, a gate of the third switch transistor is configured to receive the baseband signal, a source of the third switch transistor is grounded, and a drain of the third switch transistor is connected to the mixer.

15. The transmitter according to claim 10, wherein the voltage output unit comprises:

a first bias circuit comprising a first resistor, a second resistor and a first output, wherein a first end of the first resistor is connected to a working power supply end, a second end of the first resistor is connected to a first end of the second resistor, a second end of the second resistor is connected to a ground terminal, the first output is disposed between the first resistor and the second resistor, and the first voltage signal is output from the first output;

a second bias circuit comprising a third resistor, a fourth resistor and a second output, wherein a first end of the third resistor is connected to the working power supply end, a second end of the third resistor is connected to a first end of the fourth resistor, a second end of the fourth resistor is connected to a ground terminal, the second output is disposed between the third resistor and the fourth resistor, and the second voltage signal is output from the second output.

16. The transmitter according to claim 15, wherein each of the second resistor and the fourth resistor is a variable resistor.

17. The power amplification apparatus according to claim 15, wherein the power amplification apparatus further comprises a control module configured to determine a first voltage value corresponding to the first voltage signal according to a saturation current parameter, an on voltage threshold and a drain/source voltage parameter of the first switch transistor, and a power supply voltage parameter, and adjust a resistance value of the second resistor according to the first voltage value, so that the voltage output unit outputs the first voltage signal satisfying the first voltage value; and the control module is further configured to determine a second voltage value corresponding to the second voltage signal according to the power supply voltage parameter and a drain voltage parameter of the first switch transistor, and adjust a resistance value of the fourth resistor according to the second voltage value, so that the voltage output unit outputs the second voltage signal satisfying the second voltage value;

wherein the power supply voltage parameter is an output voltage of the working power supply end.

18. The power amplification apparatus according to claim 10, wherein a plurality of power amplification modules are provided, and the power amplification apparatus further comprises a control module connected to each of the power amplification module.

* * * * *